United States Patent [19]
McCullough et al.

[11] Patent Number: 6,097,474
[45] Date of Patent: Aug. 1, 2000

[54] DYNAMICALLY ADJUSTABLE HIGH RESOLUTION ADJUSTABLE SLIT

[75] Inventors: Andrew W. McCullough, Newtown; Pradeep K. Govil, Norwalk; Daniel N. Galburt, Wilton; David Callan, Norwalk, all of Conn.

[73] Assignee: SVG Lithography Systems, Inc., Wilton, Conn.

[21] Appl. No.: 09/391,928

[22] Filed: Sep. 8, 1999

Related U.S. Application Data

[60] Division of application No. 09/232,758, Jan. 15, 1999, which is a continuation-in-part of application No. 09/023,407, Feb. 12, 1998, Pat. No. 5,895,737, which is a continuation-in-part of application No. 08/829,099, Mar. 31, 1997, Pat. No. 5,966,202.

[51] Int. Cl.$^7$ ............................. G03B 27/72; G03B 27/42
[52] U.S. Cl. ............................................. 355/69; 355/53
[58] Field of Search ................................ 355/53, 67–71; 430/5, 20, 30

[56] References Cited

U.S. PATENT DOCUMENTS

| | | | |
|---|---|---|---|
| 4,017,162 | 4/1977 | Mills | 350/271 |
| 4,047,808 | 9/1977 | Bartlett | 350/271 |
| 4,509,290 | 4/1985 | Stanfield, Jr. | 49/92 |
| 4,516,852 | 5/1985 | Liu et al. | 356/121 |
| 4,769,667 | 9/1988 | Ishiguro et al. | 354/435 |
| 4,920,552 | 4/1990 | Hermens | 378/153 |
| 5,107,530 | 4/1992 | Allison | 378/160 |
| 5,469,905 | 11/1995 | McKinney et al. | 160/35 |
| 5,598,250 | 1/1997 | Bae | 355/67 |
| 5,602,619 | 2/1997 | Sogard | 355/53 |
| 5,631,721 | 5/1997 | Stanton et al. | 355/71 |
| 5,635,999 | 6/1997 | O'Brien et al. | 396/508 |
| 5,724,122 | 3/1998 | Oskotsky | 285/67 |
| 6,002,467 | 12/1999 | Nishi et al. | 355/61 |

*Primary Examiner*—Safet Metjahic
*Assistant Examiner*—Hung Henry Nguyen
*Attorney, Agent, or Firm*—Fattibene & Fattibene; Paul A. Fattibene; Arthur T. Fattibene

[57] ABSTRACT

Blades pivotally attached together linked to push rods and inserted into an illumination field, energy or flux. The blades extend longitudinally along the length of a rectangular illumination field or slit used to image a reticle onto a photosensitive substrate. The blades controllably adjust the width of the rectangular illumination field to modify the illumination intensity or energy provided to a photosensitive substrate. The illumination field is scanned across the photosensitive substrate to expose it with the image of a reticle. The blades are dynamically controlled during the scanning exposure to adjust the illumination intensity or energy in a predetermined way. The resulting selective change in exposure dose corrects local area of line width variance. Various errors in pattern reproduction using a photolithographic system are relatively easily corrected. This is particularly advantageous in a scanning lithography system used in the manufacture of semiconductors.

8 Claims, 12 Drawing Sheets

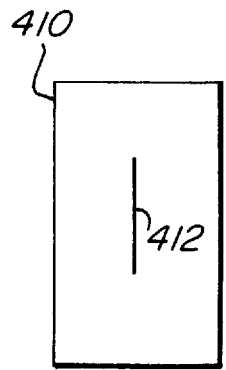
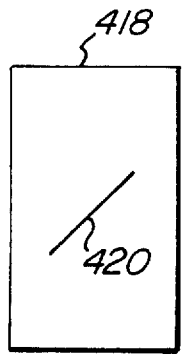
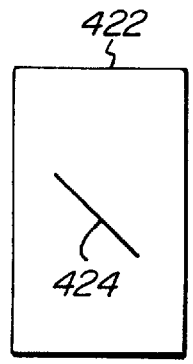
FIG. 8A   FIG. 8B   FIG. 9A   FIG. 9B
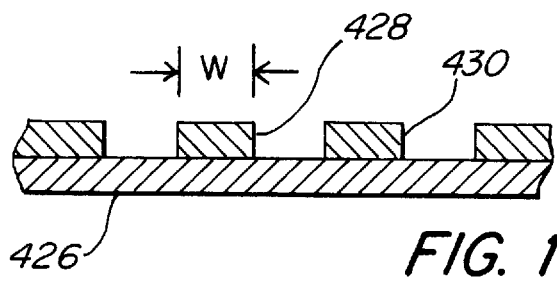
FIG. 10
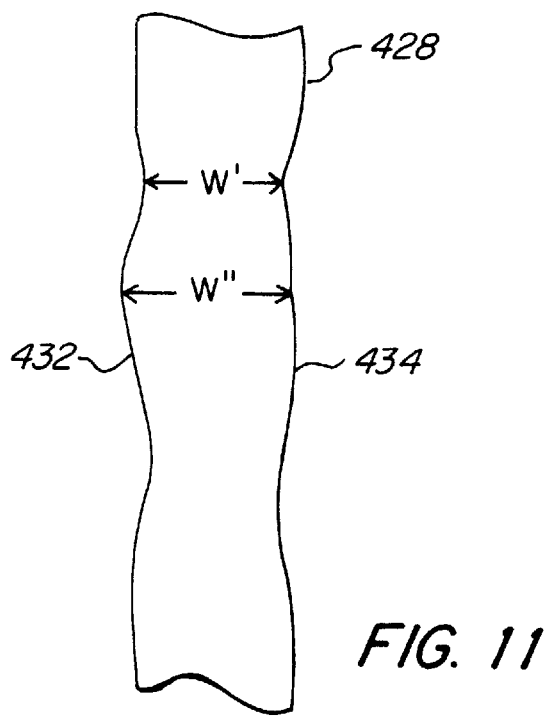
FIG. 11

DYNAMICALLY ADJUSTABLE HIGH RESOLUTION ADJUSTABLE SLIT

RELATED APPLICATIONS

This application is a divisional of U.S. application Ser. No. 09/232,758 filed Jan. 15, 1999 which is a continuation-in-part of U.S. application Ser. No. 09/023,407 filed Feb. 12, 1998 now U.S. Pat. No. 5,895,737 which is a continuation-in-part of U.S. application Ser. No. 08/829,099 filed Mar. 31, 1997 now U.S. Pat. No. 5,966,202.

FIELD OF THE INVENTION

The present invention relates generally to illuminating a reticle for use in lithography as used in manufacturing semiconductor devices, and particularly to dynamically adjusting the illumination field for providing a desired exposure to control and reduce line width variation over local areas.

BACKGROUND OF THE INVENTION

In the process of semiconductor manufacturing, lithography or photolithography is typically used to project light through a reticle exposing a silicon wafer coated with photosensitive resist in select regions to define circuit elements. An illumination system has been used in step-and-scan photolithography equipment sold under the trademark MICRASCAN by SVG Lithography Systems, Inc. Wilton, Conn. In this photolithography equipment, the reticle and the wafer move with different speeds. The different speeds having a ratio equal to the magnification of the projection optics. A rectangular or slit field defined by the illumination system is scanned over the reticle and over the wafer. A vertical field delimiter frames the vertical field height, and horizontal framing blades frame the horizontal field width. It is desirable to have as uniform an exposure field as possible. The illumination level is the integral, in the scan direction, of the illumination on the wafer. Often the illumination is not uniform enough. To obtain a uniform exposure or a constant level of illumination from the top to bottom longitudinally along the rectangular exposed field, an adjustable slit is often required. In the past adjustable slits have been used that employed a line of nails or projections perpendicular to the illumination beam. Individual nails or projections would be pushed into the illumination beam to make more uniform the illumination level or energy. Additionally, metal strips placed at an angle to the illumination beam would be bent or warped by rods thereby adjusting and making more uniform the illumination level or energy. One type of compliant member or adjustable slit is disclosed in U.S. Pat. No. 4,516,852 entitled "Method and Apparatus for Measuring Intensity Variations in a Light Source", issuing to Liu et al on May 14, 1985. Therein disclosed is an arcuate slit that is adjusted with a deformable band. While these prior adjustable slit devices have been helpful in providing a more uniform illumination field the ever increasing demands placed on lithography in reducing feature size of semiconductor devices and increasing yield require an even more uniform illumination field.

SUMMARY OF THE INVENTION

The present invention is a device for adjusting a rectangular illumination field or slit for providing a uniform or desired illumination field used in scanning lithography. A plurality of blades are coupled or linked together so as to form a movable edge along a length of the rectangular illumination field. The ends of each blade are attached by a pivot pin to a link. The link is attached by a pivot pin to a push rod. The link may be a rigid link or a flexure. The push rods are independently adjustable causing the blades to be controllably inserted into and out of the rectangular illumination field. The edge corners of the blades have a radius equal to the distance of the pivot pin to the edge of the blade. The present invention also includes a method of providing a predetermined exposure dose along the longitudinal length of the illumination filed depending upon the line width of a feature to be imaged. In another embodiment of the present invention the width of the illumination field along a longitudinal length is adjusted dynamically or during scanning of the illumination field over a photosensitive substrate or wafer. A corrected exposure dose is calculated based upon stored information of the photolithographic system or tool signature, the particular reticle, and the resist response function. The width of the illumination field is adjusted to obtain the corrected exposure dose.

Accordingly, it is an object of the present invention to make more uniform a rectangular illumination filed.

It is another object of the present invention to provide a constant illumination flux along a longitudinal length of the rectangular illumination field.

It is an object of another embodiment of the present invention to locally adjust the illumination flux or energy to compensate for local areas of line width variance.

It is an advantage of the present invention that a smoothly continuous adjustment is made to the rectangular illumination field.

It is another advantage of the present invention that adjustments may easily be made to the rectangular illumination filed.

It is another advantage of the present invention that a constant line width to exposure ratio can be maintained improving system performance.

It is an advantage of another embodiment of the present invention that illumination intensity or energy can be varied at different locations along an illumination field continuously during scanning.

It is a feature of the present invention that blades are coupled together by pivots forming an adjustable edge.

It is another feature of the present invention that a link is used between the blade and a push rod.

It is a feature of an embodiment of the present invention that exposure dose is calculated and controlled by an illumination adjuster.

These and other objects, advantages, and features will become more apparent in view of the following detailed description.

BREIF DESCRIPTION OF THE DRAWINGS

FIG. 1 pictorially illustrates the illumination profile of a rectangular illumination field and the application of the present invention.

FIG. 2 graphically illustrates illumination energy.

FIG. 3 schematically illustrates an embodiment of the present invention.

FIG. 4 schematically illustrates the movement of the blades of the present invention.

FIG. 8A is a schematic illustration of a reticle having a vertical feature.

FIG. 8B is a schematic illustration of a reticle having a horizontal feature.

FIG. 9A is a schematic illustration of a reticle having a first feature.

FIG. 9B schematically illustrates a reticle having a second feature orthogonal to the first feature illustrated in FIG. 9A.

FIG. 10 is a cross section schematically illustrating lines lithographically produced on a substrate.

FIG. 11 schematically illustrates in plan view a portion of a lithographically produced line.

Figure 12:
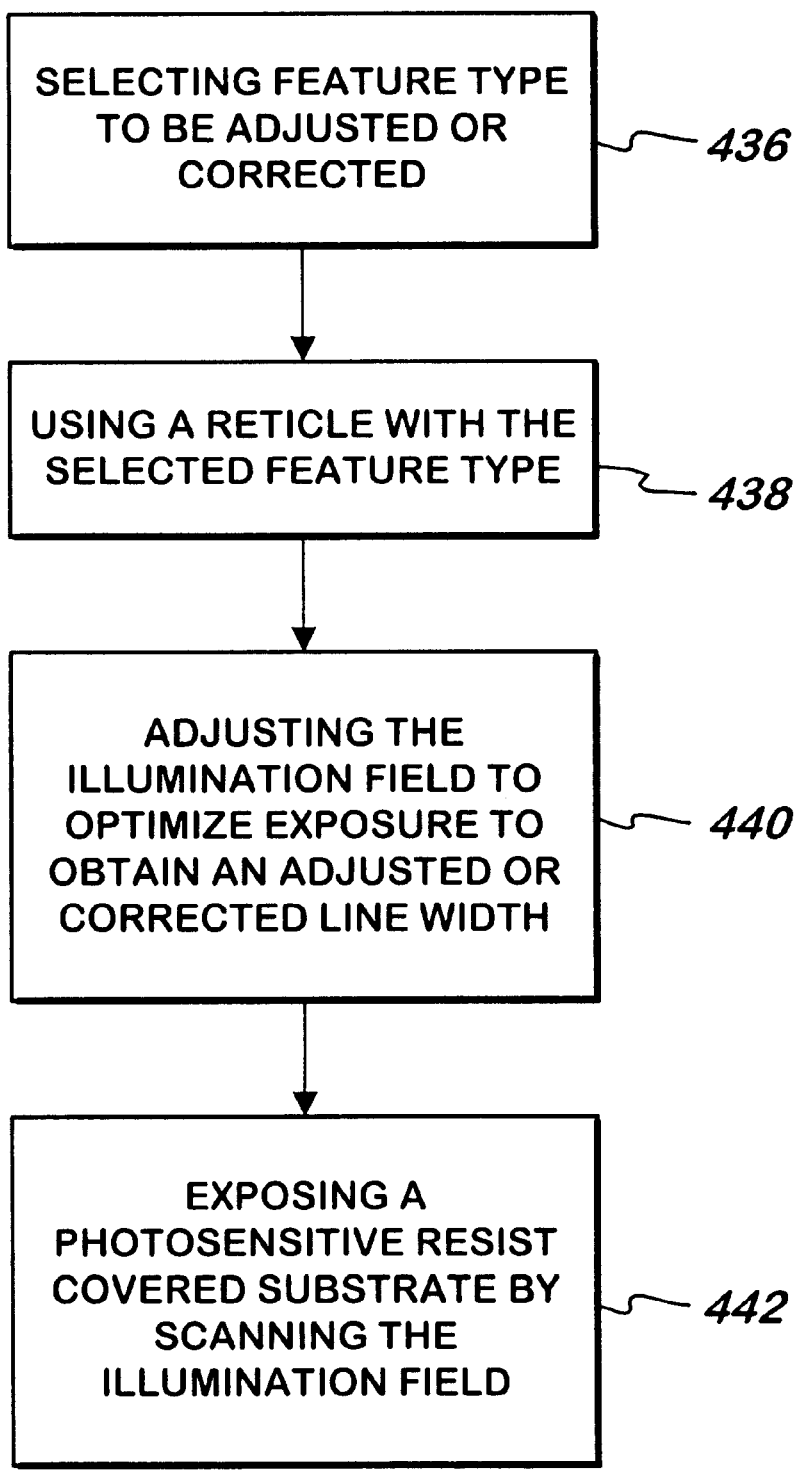

FIG. 12 is a block diagram illustrating the method steps of another embodiment of the present invention.

Figure 13:
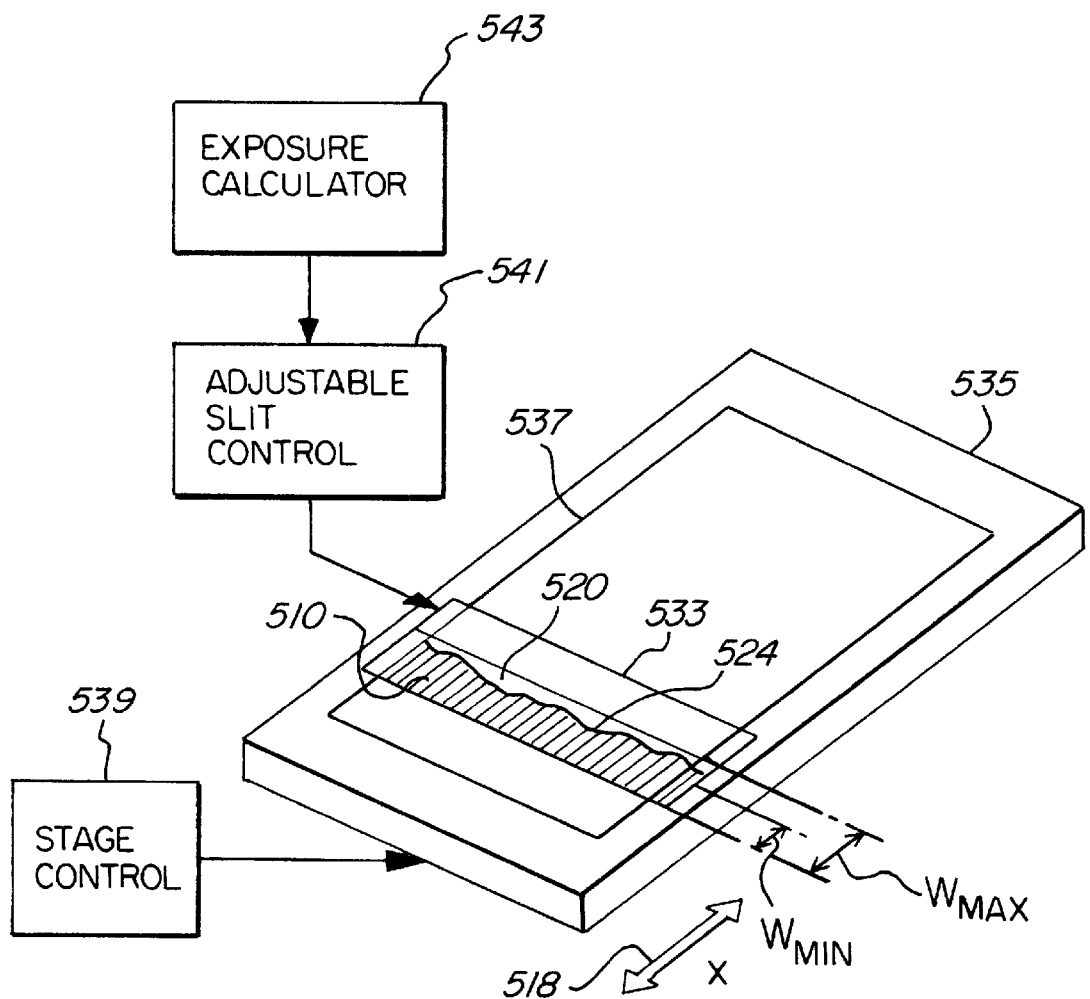

FIG. 13 is a schematic drawing illustrating the dynamically adjustable illumination field of another embodiment of the present invention.

Figure 14:
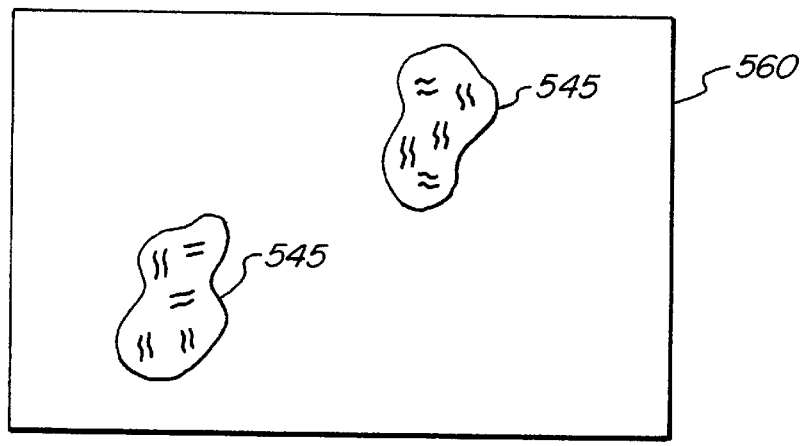

FIG. 14 is a schematic plan view illustrating local areas of line width variance.

Figure 15:
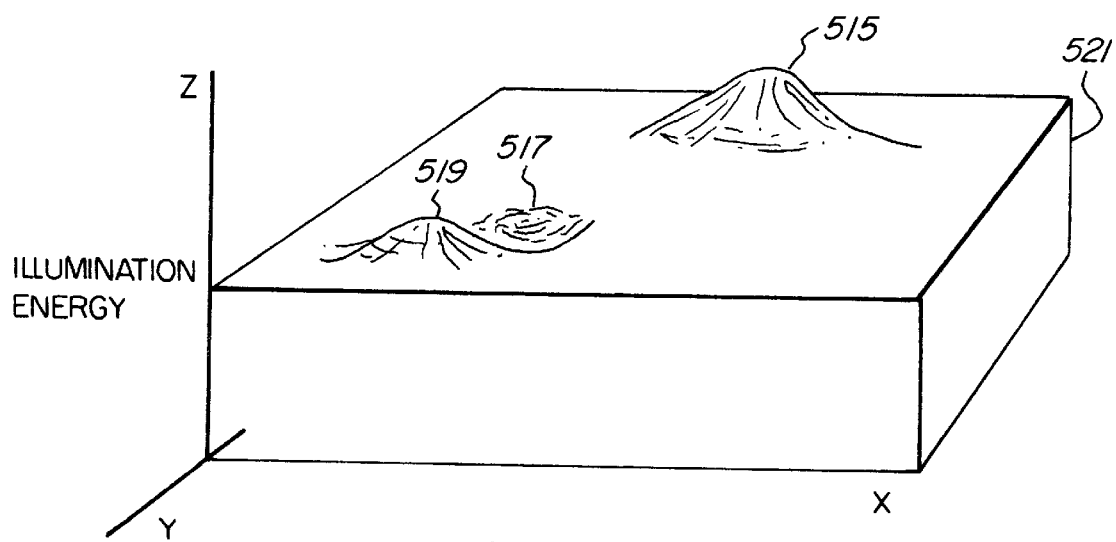

FIG. 15 is a graph illustrating the illumination intensity or energy provided to a photosensitive substrate.

Figure 16:
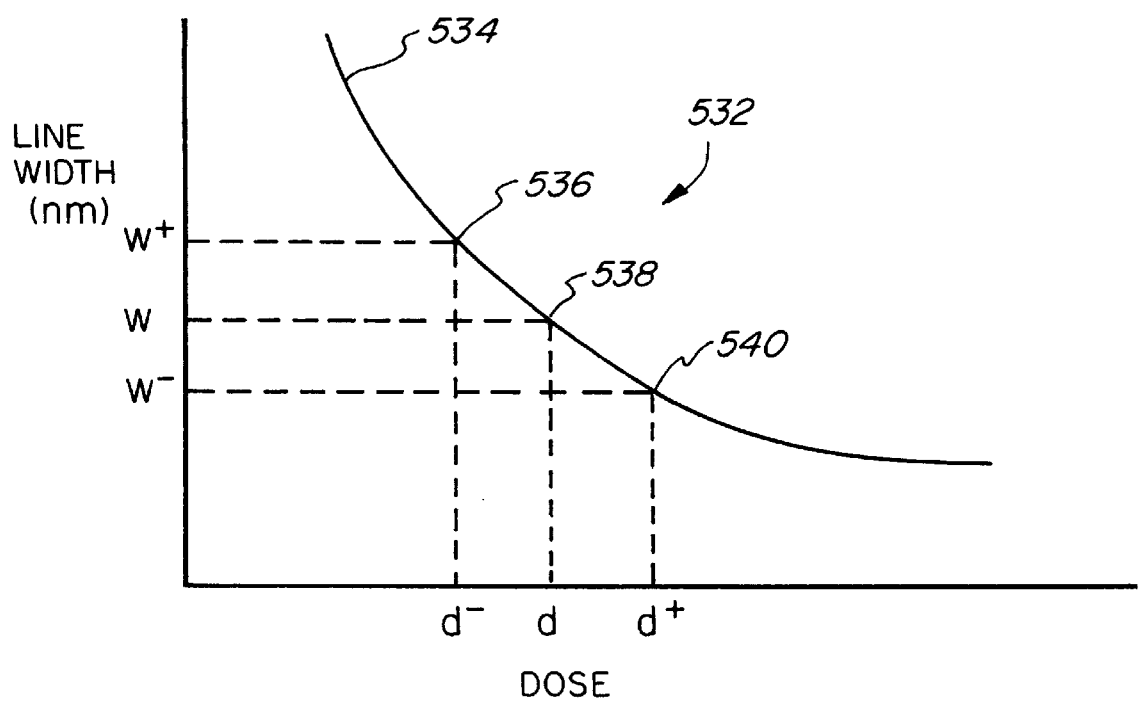

FIG. 16 is a graph illustrating a positive resist response function.

Figure 17:
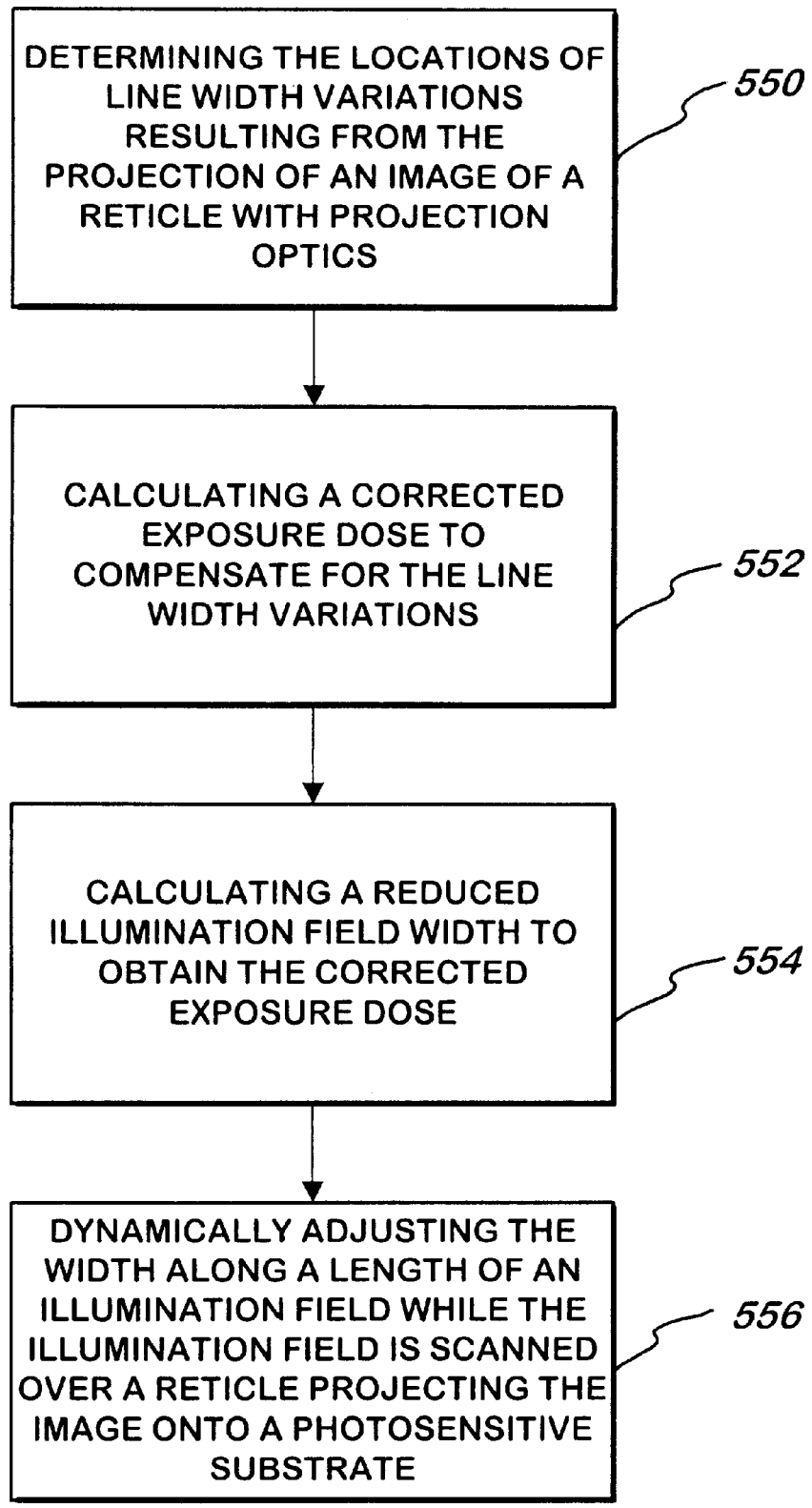

FIG. 17 is block diagram illustrating the method steps of an embodiment of the present invention.

Figure 18:
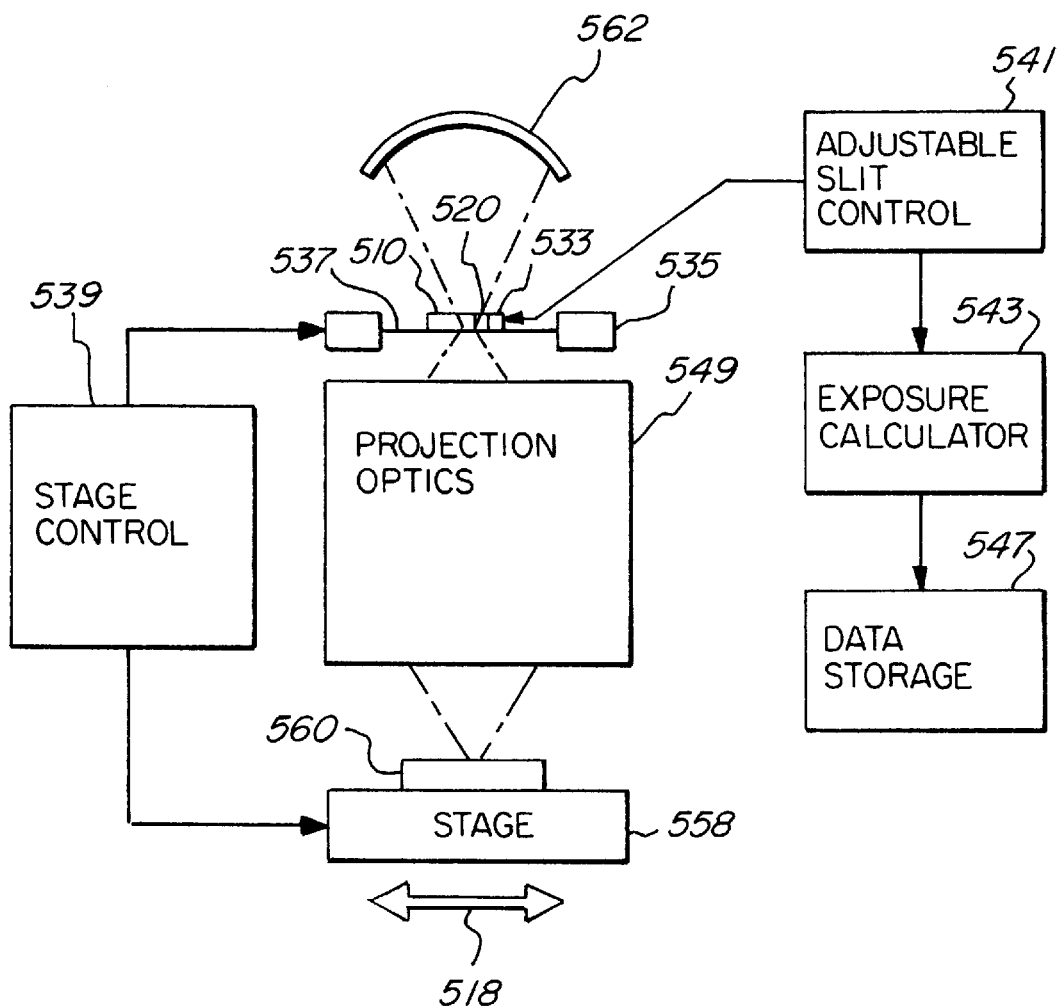

FIG. 18 is schematic diagram illustrating a photolithographic system or tool incorporating an embodiment of the present invention.

DETAILED DESCRIPTION OF THE PREFERED EMBODIMENTS

Figure 1:
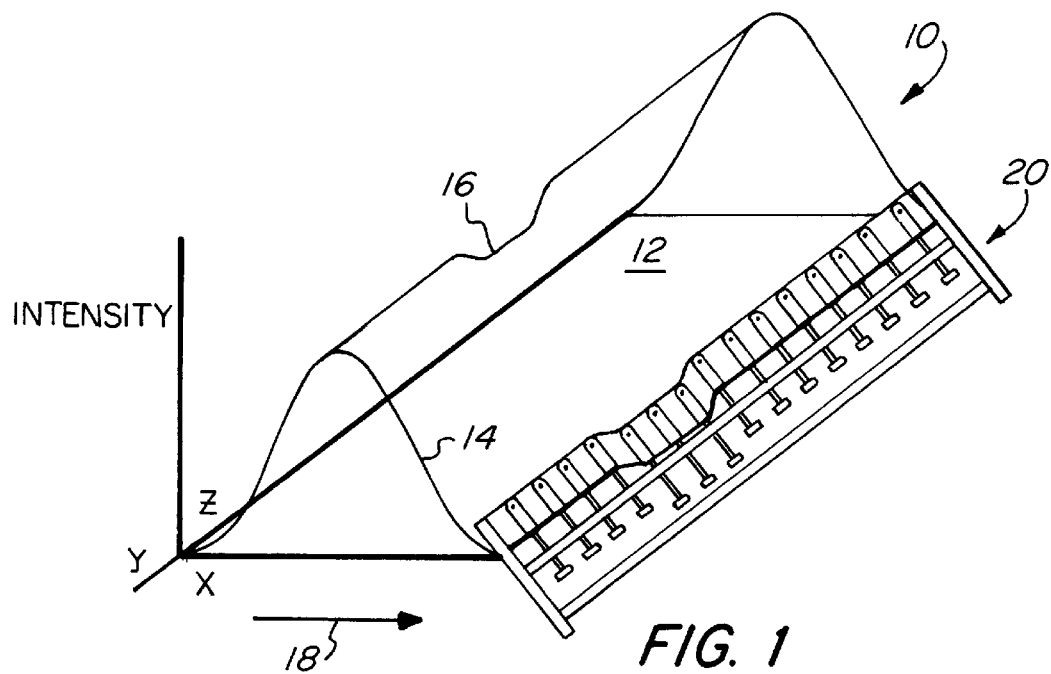

FIG. 1 illustrates an illumination profile 10 produced by an illumination system, not illustrated. A rectangular illumination field or slit 12 is formed. The illumination field 12 has a length along the Y axis and a width along the X axis. Waveform 14 illustrates the intensity distribution along the X direction or width of the rectangular illumination field 12. The illumination profile 10 may have non-uniformities. Waveform 16 illustrates a non-uniformity. This non-uniformity may result in uneven exposure of a photosensitive resist covered substrate, such as a wafer which may result in poor quality or reduced yield. The present invention is illustrated generally as an adjustable slit device 20. The adjustable slit device 20 has a plurality of adjustable blades that are selectively inserted into the illumination profile 10 along a longitudinal length of the rectangular illumination field or slit 12. The illumination energy or flux of the rectangular illumination field is thereby adjusted correcting or making more uniform the illumination energy or flux along the longitudinal length of the rectangular illumination field. Therefore, when the rectangular illumination field 12 is scanned in the X direction, indicated by arrow 18, a desired more uniform exposure is obtained.

Figure 2:
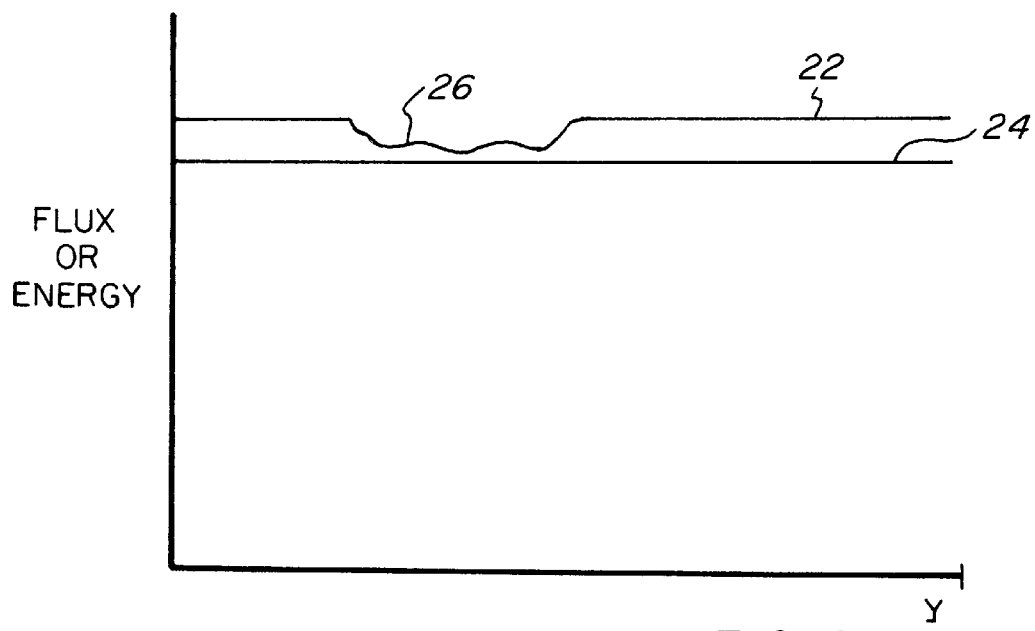

FIG. 2 graphically illustrates the improved more uniform illumination energy or flux achievable with the present invention. In FIG. 2, waveform 22 illustrates the total or integral of the uncorrected illumination energy or flux along the width of the rectangular illumination field, illustrated in FIG. 1, along the Y axis or longitudinal direction. Portion 26 of wafeform 22 illustrates the reduced illumination energy or flux as a result of the non-uniformity 16, illustrated in FIG. 1. Waveform 24 illustrates the more uniform illumination energy or flux as a result of inserting selected blades of the adjustable slit device 20, illustrated in FIG. 1, into the illumination profile 10. It should be noted that the energy level or flux along the Y direction or longitudinal length of the rectangular illumination filed or slit 12, illustrated in FIG. 1, is more constant or uniform. This results in a desirable more uniform exposure of a photosensitive resist covered substrate.

Figure 3:
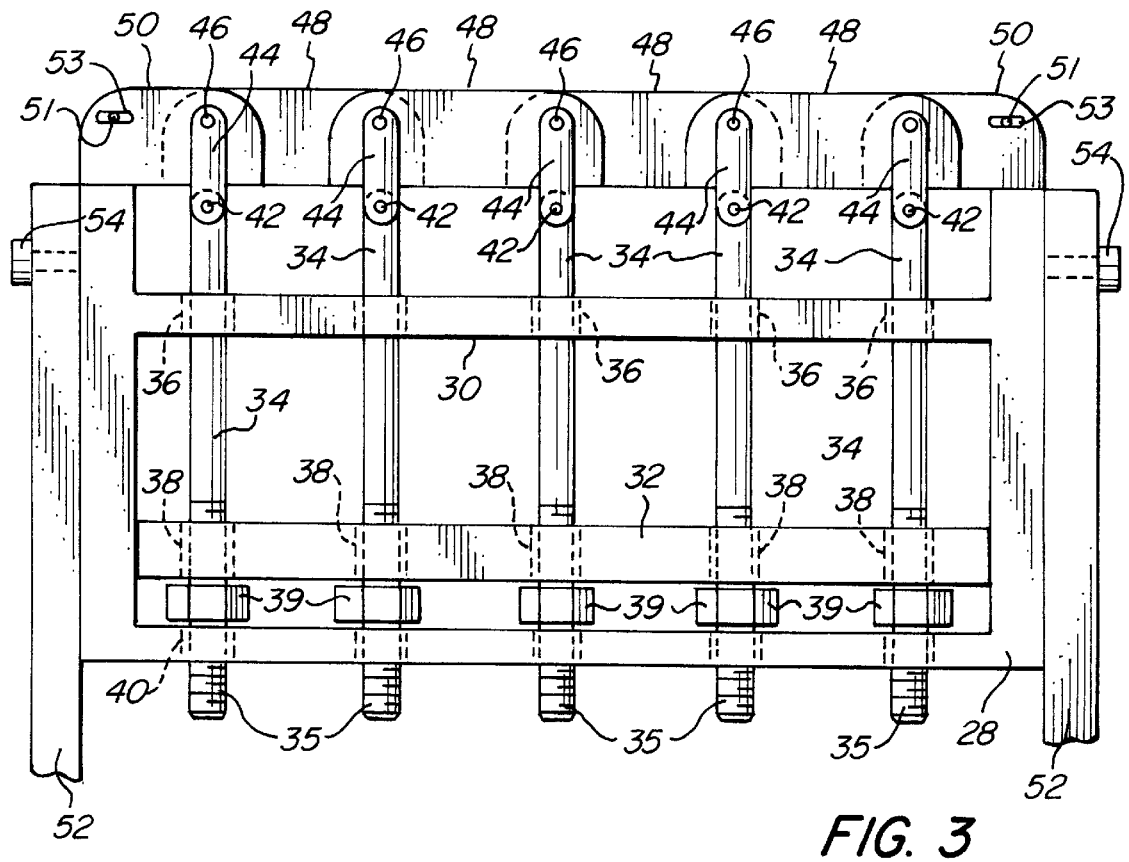

FIG. 3 generally illustrates an embodiment of the present invention. A frame 28 has an upper support 30 and a lower support 32. Upper support 30 has upper bores 36 therein. Lower support 32 has lower bores 38 therein. Push rods 34 are placed within the respective bores 36 and 38. The bores 36 and 38 have a diameter of sufficient size to permit push rods 34 to slide therein. One end of each of the push rods 34 is threaded and extends through frame bores 40 in frame 28. Placed between the lower support 32 and a portion of the frame 26 are placed nuts 39 threaded onto the threaded portion 35 of push rods 34. The other ends of push rods 34 are attached to a connecting link 44 by link pivot pins 42. The other end of connecting link 44 is attached to one end of a blade 48 by blade pivot pins 46. Therefore, one push rod 44 is coupled to each end of the blades 48 with the exception of end blades 50. End blades 50 have one end coupled to a push rod 44 and the other end coupled to frame 28 with end pivot pin 51. The end blades 50 may have slots 53 therein. The blades 48 are generally or substantially rectangular in shape, but have two corners with a radius. The radius is substantially equal to the distance between the pivot pin 46 and the edge of the blade 48. Extension supports 52 are attached so as to slide along the side of frame 28. The extension supports 52 may be attached to a rigid support structure, not shown. Set screws 54 are used to secure the sliding extension supports 52. The extension supports 54 are used to move or raise the entire frame 28, including the row of blades 48, in unison or all at once. This permits the row of blades 48 to be moved up or down into a predetermined position without individually moving the blades 48. This may be done for initial positioning or to quickly move the blades when a large adjustment is needed.

Figure 4:
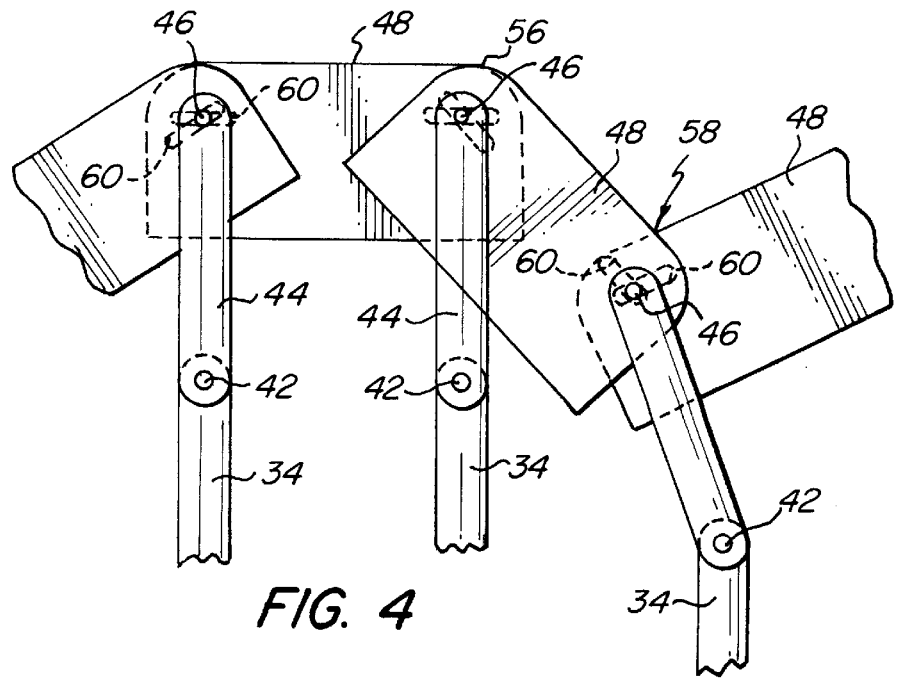

FIG. 4 more clearly illustrates a portion of the adjustable slit device including several of the blades 48 and their motion.

Radius 56 on the corners of the blades 48 provide a smooth transition between adjacent blades 48. A saw tooth shape may also be formed at the intersection 58 of two blades 48. Additionally, one end of each blade 48 may have a slot 60 therein. The slot 60 may be positioned at every other blade pivot pin 46.

The operation of the device can readily be appreciated with reference to FIGS. 3 and 4. Adjustments to the illumination energy are made by moving push rods 34 which displace blades 48 selectively into the illumination energy or flux. Push rods 34 are independently adjusted by turning nuts 39. As the push rods 34 are caused to move up and down within the upper and lower supports 30 and 32 the respective blades are moved. Links 44 attached to the blades 48 provide lateral or sideways flexibility. The flexibility is needed due to the nominal differential sideways movement of the spacing between push rods 34 when the blades 48 are moved out of a straight line. Without this flexibility of sideways movement undue stress or stain may be placed on the push rods 34 or the blades 48. The slots 60 in blades 48 additionally help reduce any stress or strain due to the movement of blades 48. Slots 53 may also be placed in the ends 50. The flexibility may also be provided by attaching links 44 with a flexure rather than a pivot pin 42. Additionally, a flexure may be used rather than the rigid link 44 to provide sideways flexibility. If frictional forces are not adequate to securely hold the blades 48 in position, one end of the line of blades may be spring loaded so that a predetermined tension or bias is applied to the blades 48.

It should be appreciated that while the push rods 34 have been illustrated to be moved with a threaded portion and a nut any other suitable means or device for moving the push rods 34 is possible, such as other mechanical or electromechanical means well known to those skilled in the art. Additionally, other threaded or screw type push rods designs could be easily adapted to move the blades 48 in practicing the present invention. While the resolution of the adjustable slit device is only dependent on the number of individual blades 48 used, generally as few as approximately fifteen individual blades 48 have been used with much success.

Figures 5A, 5B:
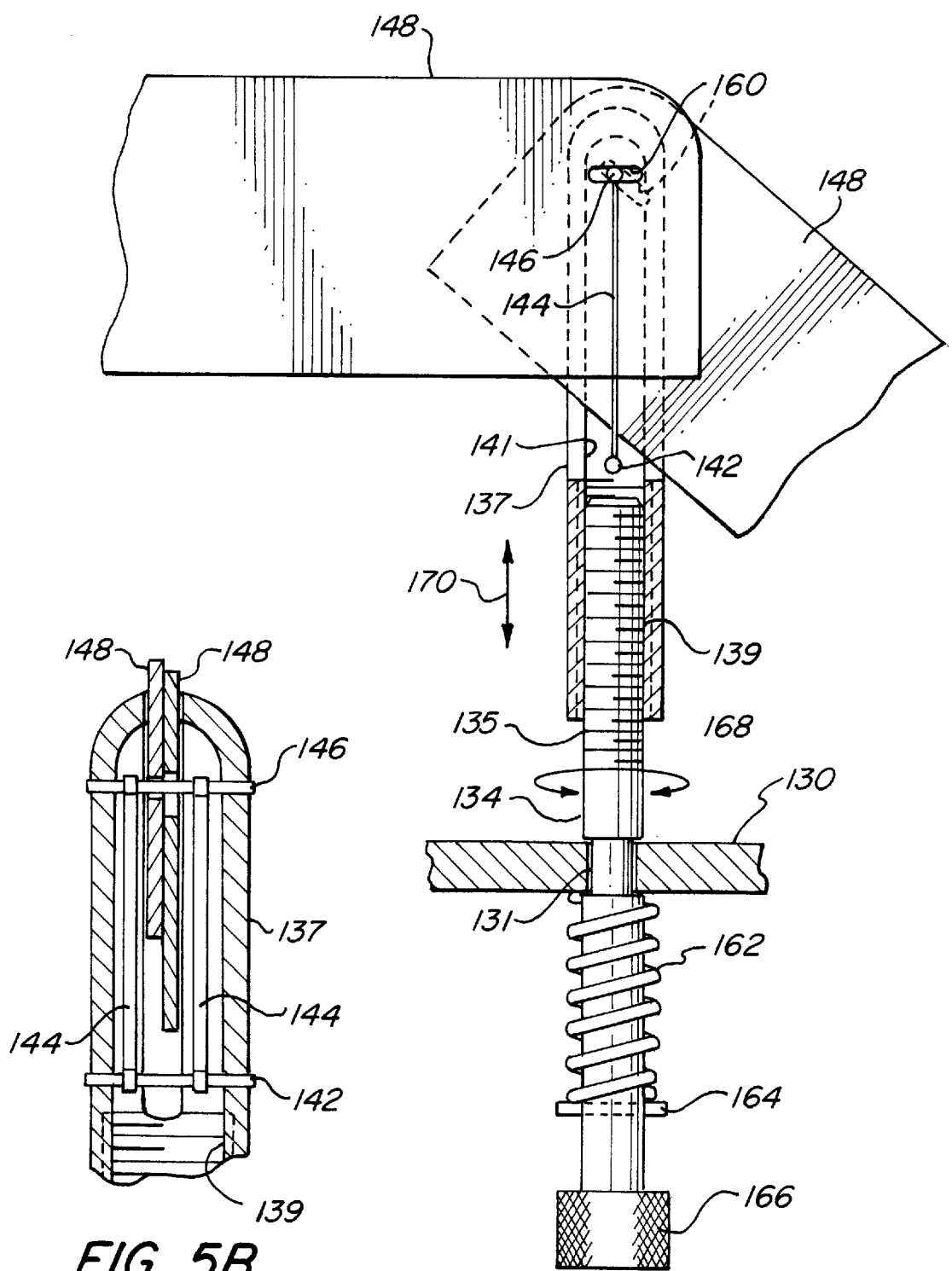
FIG. 5A is a partial cross section of a portion of an embodiment of the present invention.
FIG. 5B is a partial cross section of a portion of the invention illustrated in FIG. 5A rotated ninety degrees.

FIGS. 5A and 5B illustrate a partial cross section of another embodiment of the present invention. FIGS. 5A and 5B illustrate another construction for one of the push rods that may be used in practicing the present invention. It should be appreciated and understood that FIGS. 5A and 5B only illustrate one of the push rods in which there would be a number or a plurality of push rods with a number or plurality of blades similar to that illustrated in FIG. 1 and FIG. 3. In FIGS. 5A and 5B, the blades 148 are pivotally connected together with a blade pivot pin 146. The pivot pin 146 extends through a push rod threaded extension 137. The push rod extension 137 is bifurcated so that the blades 148 can fit there between. The push rod extension 137 has a longitudinal bore 141 and internal threads 139 therein. The push rod 134 has external threads 135 thereon. The push rod 134 also has a reduced diameter 131 into which is positioned a support 130. The reduced diameter 131 prevents the push rod 134 from moving axially. Circumscribing the lower half of the push rod 130 is a helical spring 162. The helical spring 162 is confined at one end by the support 130 and at the other by a spring stop 164 attached to the push rod 134. On one end of the push rod 134 may be placed a knob 166. Placed within the longitudinal bore 141 of the push rod threaded extension 137 is at least one flexure 144. The flexure 144 is attached to the push rod extension 137 with a pin 146 placed through slots 160 in the blades 148. Slots 160 are elongated holes placed within the blades 148. Not all blades 148 need have elongated holes or slots 160. The other end of the flexure 144 is pinned to the push rod threaded extension 137 with pin 142. The flexure 144 provides a flexible link which permits lateral or sideways movement of the blades 148. Accordingly, the blades 148 are flexibly linked to the push rod threaded extension 137 which is threaded into the push rod 134. FIG. 5B is a partial cross-section illustrating another view of the push rod threaded extension 137 that is turned or rotated approximately ninety degrees from the view illustrated in FIG. 5A. In FIG. 5B, the flexures 144 are more clearly illustrated. FIG. 5B illustrates two flexures, one on each side of the blades 148. However, it should be appreciated that only one flexure is needed, although in some applications two may be preferable. The flexures 144 may also have a rectangular cross-section such that sideways or lateral movement of the row of blades is permitted and movement out of the plane of the row of blades is limited by the larger lengthwise dimension of the rectangular cross-section of the flexure 144.

The operation of the embodiment illustrated in FIG. 5A and FIG. 5B should readily be appreciated. As knob 166 is turned such that the push rod 134 is rotated in either direction as indicated by arrow 168, the push rod threaded extension 137 is caused to move up and down in the direction illustrated by arrow 170. Accordingly, the ends of the blades 148 are caused to move up and down. Thereby, the blades 148 are inserted or removed from the illumination, illustrated generally as 10 in FIG. 1. Spring 162 places a slight tension on the external threads 135 and internal threads 139 which prevent any unintentional turning, as well as take up any play that may exist. When a plurality of push rods are used in a system with a plurality of blades 148 linked together, the moving up and down of the push rods 134 causes the blades 148 to move up and down, results in sideways or lateral forces being placed on the pins 146 attaching the blades 148 together. Much of these lateral or sideways forces are compensated for by the movement of flexure 144 laterally or sideways. The embodiment, illustrated in FIGS. 5A and 5B, is therefore similar to that illustrated in FIGS. 3 and 4. However, the rigid links 44, illustrated in FIGS. 3 and 4, are replaced with flexures 144. Both the link, 44 illustrated in FIGS. 3 and 4 and the flexure 144, illustrated in FIGS. 5A and 5B, are a type of link in that they both connect or couple the blades 48 and 148 to the push rods 34 and 134 to perform the same function or purpose in providing sideways or lateral movement as the plurality of blades 48 or 148 are moved into and out of the illumination, as illustrated in FIG. 1.

Figure 6:
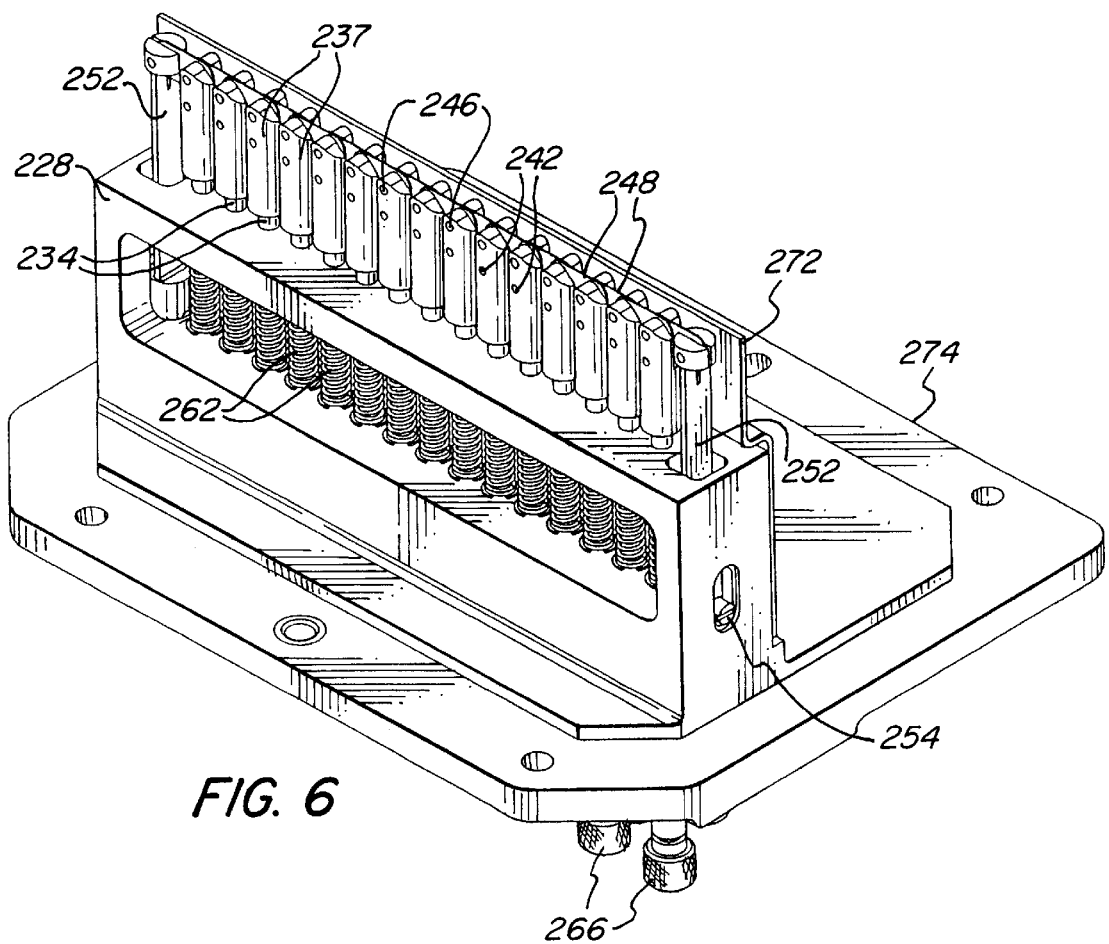
FIG. 6 is a perspective view of the present invention.

FIG. 6 is a perspective view illustrating the present invention in an assembled form that may be placed in a lithography tool. Frame 228 is attached onto a mount 274. A plurality of push rods 234, in this embodiment fifteen, are held in position by frame 228. Threaded onto one end of the plurality of push rods 234 are a plurality of push rod threaded extensions 237. Each push rod extension 234 is connected to two blades 248 by a blade pivot pin 246. The blade pivot pins 246 also attach one end of a link, not shown, to the push rod threaded extensions 237 and blades 248. The link may be a rigid link or a flexible link, such as a flexure. Link pivot pins 248 attach the other end of the link, not shown, to the push rod threaded extensions 246. The structure is very similar to that illustrated in FIGS. 5A and 5B. Each end of the row of linked blades 248 is attached to an extension support 252. Extension supports 252 slide within frame 228 and are locked into position with set screw 254. Extension supports 252 permit the row of linked blades 248 to be raised in a group. This facilitates initial positioning of the row of linked blades 248. Springs 262 are placed around each push rod 34. At the other end of the push rods 234 are placed knobs 266. The knobs 266 are used to individually turn the push rods 234 causing the respective blades 248 to move up and down, or into and out of a rectangular illumination field, not shown. A stationary shield 272 may be placed near the row of blades 248.

In some applications it may be desirable to provide a predetermined non-uniform exposure to a photosensitive resist covered substrate or wafer. For example this may be desired when features to be imaged on the photosensitive resist covered substrate have different line widths. These different line widths may be at different locations along the longitudinal lengths of the illumination field. Normally, it is desirable to keep the uniformity along the length of the rectangular illumination field constant. However, when a variety of different line widths are desired to be imaged it is advantageous to very the exposure dose as a function of the line width. A constant line width to exposure dose ratio can be maintained to improve imaging and system performance. That is when a line width is relatively wide the exposure dose is increased at the corresponding longitudinal position in the illumination field, and when a line width is relatively narrow the exposure dose is decreased at the corresponding longitudinal position in the illumination field. The preferred or corrected exposure dose is independent of orientation of the feature, for example if the line is oriented in a vertical or horizontal direction. The increasing or decreasing of an exposure dose along the longitudinal length of an illumination field is easily accomplished with the device of the present invention. Simulations have indicated that such a method of correction will be independent of feature size and type over the range of linear response of a system. Additionally, bias between group and isolated features will not be affected.

Figure 7:
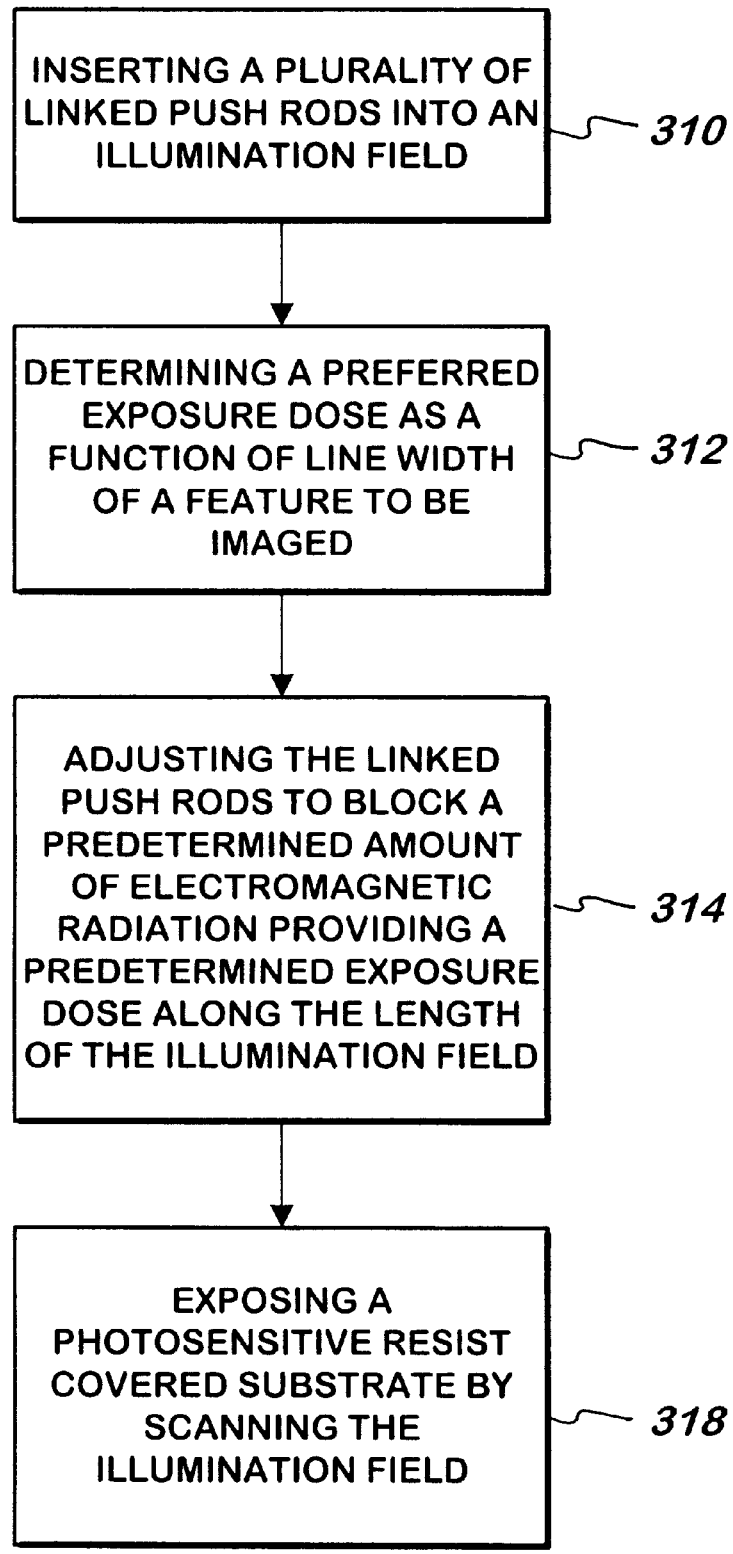
FIG. 7 is a block diagram illustrating the method steps of the present invention.

FIG. 7 is a block diagram illustrating a method of the present invention. Box 310 represents the method step of inserting a plurality of linked push rods into an illumination filed. The linked push rods may comprise a device as illustrated in FIGS. 3–6. Box 312 represents the method step of determining a preferred exposure dose as a function of line width of a feature to be imaged. The preferred exposure dose can easily be calculated based on well known techniques and may consider such variables as type of resist, substrate material, illumination energy, illumination wavelength, scanning speed, among others. The calculations may be performed by a computer, or obtained from a look-up table providing exposure dose as a function of line width. The preferred exposure dose may even be obtained by actual experimental results or a series of text exposures. Box 314 represents the step of adjusting the individual linked push rods to block a predetermined amount of electromagnetic readiation. This provides a predetermined exposure dose at predetermined positions along the length of the illumination field. Box 318 represents the step of exposing a photosensitive resist covered substrate by scanning the illumination field over the substrate. In practicing the method of the present invention the exposure dose along a longitudinal length of the illumination field is adjusted as a function of the line width of the pattern on the reticle at a corresponding location. As the line widths vary on the reticle corresponding locations along the illumination filed are adjusted to obtain a desired or optimized exposure dose. The adjustments in exposure dose may be made automatically by motors attached to the linked push rods. The adjustments in the exposure dose of the illumination field are made for each reticle used, and can be easily changed for each different reticle.

In another embodiment of the present invention different feature types of patterns are imaged separately to optimize formation of an image on a photosensitive substrate, such as a photosensitive resist or photoresist covered wafer. FIGS. 8A and 8B illustrate reticles having different feature types. A vertical reticle 410 is illustrated having a vertical feature type 412 thereon. A horizontal reticle 412 is illustrated having a horizontal feature type 416 thereon. The vertical feature type 412 illustrated on vertical reticle 410 is greatly simplified for illustration purposes. It should be appreciated that the vertical reticle 410 is composed of a large number of elements to be imaged onto a photosensitive substrate or photoresist covered substrate. However, the vertical reticle 412 contains thereon predominantly vertical feature types, such as lines oriented primarily in the vertical direction. Similarly, FIG. 8B illustrates a horizontal reticle 414 having horizontal feature types 416 thereon. Similar to the vertical reticle 410, it should be appreciated that the horizontal reticle 414 has thereon a relatively large number of horizontal feature types 416, such as lines that are predominantly oriented in the horizontal direction. The vertical feature types 412 being orthogonal or at right angles to the horizontal feature types 416. The use of the terms horizontal and vertical are relative and are used for convenience. The horizontal and vertical orientations of the feature types may be rotated with reference to the reticle. This is illustrated in FIGS. 9A and 9B. In FIG. 9A a first reticle 418 has a first feature type 420 thereon. In FIG. 9B a second reticle 422 has a second feature type 424 thereon. The first and second feature types 420 and 424 may be oriented at different angles relative to the reticle orientation. However, preferably the first feature type 420 is orthogonal relative to the second feature type 424.

FIG. 10 schematically illustrates a cross section of a portion of a semiconductor device manufactured with lithographic techniques. Placed on a substrate 426 are a first line 428 and a second line 430. Only one layer is illustrated in FIG. 10, however, typically many different layers may be added depending upon the semiconductor device being manufactured. The first line 428 has a lateral width W and a space between adjacent lines. However, the term line width may also be used to indicate the space between adjacent lines 428 and 430.

FIG. 11 is a plan view of the first line 428 formed on the substrate 426 illustrated in FIG. 10. The first line 428 has a first edge 432 and a second edge 434. It is generally desirable that the edges 432 and 434 are straight such that the line width is uniform. With very small line widths, in the order of 120 nanometers, it is often very difficult to obtain a uniform line width and therefore straight edges with existing lithographic techniques. Accordingly, some widths along the line may be relatively narrow, such as width W', and some widths along the line 428 may be relatively wide, such as width W". This embodiment of the present invention helps to reduce the variation in line width irrespective of feature type.

FIG. 12 illustrates in block diagram form a preferred embodiment of the present invention for adjusting the illumination field, and therefore exposure, in order to achieve a more uniform line width using different selected feature types. Box 436 represents the step of selecting a single feature type to be optimized, for example, a feature type of either a vertical or horizontal orientation. Box 438 represents the step of using a reticle with the selected feature type that has been selected to be optimized. Box 448 represents the step of adjusting an illumination field to optimize exposure to achieve a more uniform line width having little variation. The step of adjusting the illumination field is preferable performed using the adjustable slit of the present invention. For example, when a line width is relatively narrow, electromagnetic illumination is blocked by the adjustable slit being inserted into the illumination field at the location of the narrow portion of the line width, reducing exposure and thereby increasing the resulting line width after processing. Where a line width is relatively wide, the adjustable slit is adjusted to increase the electromagnetic radiation at the location of the wide portion of the line width, increasing exposure resulting in a reduction in line width at the location of the relatively wide line width. Box 442 represents the step of exposing a photosensitive substrate with the dose resulting from the adjustment illumination field. As a result, line width uniformity is greatly increased. The method illustrated in FIG. 12 is then repeated for any number of desired feature types. However, it is preferable that only two selected feature types, which are orthogonal, are selected. The two selected feature types preferably have a vertical and horizontal orientation and are orthogonal, but may have any angular orientation. By practicing the present invention, very small elements or features with line widths in the order of 120 nanometers may be adjusted by as much as 50% of the line width.

The present invention is particularly suitable for deep ultraviolet step and scan lithography systems. In a scanning system, various variables or factors may result in the lithographic tool to have a particular signature. This signature may result in the imaging or printing of line widths that vary. The present invention uses adjustments in the illumination field or slot to compensate for the signature of the lithographic tool. However, different feature types may need different adjustments to optimize the resulting line width. The line width variation as a function of position along the illumination field or slot may vary depending upon different feature type orientations. This implies different focal plane shift with features oriented in various orientations. Generally, this difference is represented as a combination of common mode focal plane shift and differential mode focal plane shift. In common mode focal plane shift, adjustments may be made such that both feature types, horizontal and vertical, are similarly affected or adjusted in common. Differential mode focal plane shift results in each feature type, horizontal and vertical, being affected separately. Common mode focal plane shift results from optical field aperture, reticle/stage flatness and other variables. Differential mode focal plane shift result from astigmatism and horizontal vertical bias. While the use of different reticles having different feature types may result in additional processing time, the additional processing time may only be necessary for critical layers which, in practice, consist of a small percentage of the total layers needed to fabricate a device. Therefore, additional processing time should be relatively small. In practicing the method of this embodiment of the present invention, the line width variations are measured at locations along the length of the illumination field or slot for each feature type requiring line width correction. This may be initially performed by any conventional technique such as a test pattern with measurements being taken. The measured required line width variation correction is transformed into a required dose profile for each feature type. This dose profile is used to generate a required adjustable slit setting for a line width variation correction for each feature type. The method of this embodiment of the present invention may utilize the adjustable slit previously disclosed or any other equivalent or similar structure to vary the illumination energy along an illumination field or slot. A multiple exposure technique is used to expose the photosensitive substrate multiple times, with each exposure using a differnt reticle with a single feature type. During each exposure, the illumination field is adjusted with an adjustable slit in accordance with the measured or calculated line width variation correction for each feature type. Generally, two reticles are used resulting in two different exposures. Horizontal and vertical bias is corrected, with each reticle having the particular feature type only. Reticle design may require insertion of special end of line features to allow for good stitching of the features in different orientations where they need to be butted up against each other.

The adjustable slit may be manually changed each time a different feature type is exposed with a different reticle. However, the adjustable slit can easily be automated with suitable well known motors, sensors, and software control to set the different positions of the adjustable slit. Accordingly, the adjustable slit may be set rapidly and accurately, significantly reducing the time required to adjust the slit and thereby the illumination field energy. In order to reduce reticle switching time, reticles having the two different feature types, horizontal and vertical, may be placed on the same substrate. This may be possible with conventional reticles with no field size lost.

Accordingly, this embodiment of the present invention greatly enhances system performance in a scanning lithographic tool, and makes possible the controlled manufacture of very fine feature sizes or line widths.

Accordingly, is should be appreciated that the present invention greatly facilitates the adjustment of a rectangular illumination field or slit and provides more uniform illumination energy that is particularly useful in a scanning lithography system. The linked set of blades provides smooth transitions greatly enhancing the ability to adjust the illumination energy for providing uniformity in exposure of a photosensitive resist covered substrate, such as a semiconductor wafer. Additionally, the process or method of adjusting the illumination field according to an embodiment of the present invention greatly facilitates controlling line widths of elements having relatively small feature sizes.

FIGS. 13–17 illustrate another embodiment of the present invention that dynamically adjust the width of the illumination field to control exposure dose over local areas of the exposed photosensitive substrate. Accordingly, local areas of line width variances are compensated for during scanning of the dynamically adjustable illumination field. In this embodiment of the present invention, the adjustable slit is controlled dynamically during the scanning operation to improve imaging performance and reduce line width variations. The illumination intensity or energy delivered to any local area within the exposure field may be varied by dynamically adjusting the width of the adjustable slit.

FIG. 13 is a schematic perspective view illustrating this embodiment of the present invention. A substantially rectangular illumination field 510 has a maximum width of $W_{max}$ and a minimum width of $W_{min}$. An illumination adjuster 520 extends along a longitudinal length along one side of the substantially rectangular illumination field 510. While the illumination field 510 is illustrated as rectangular, other shapes may be used. The illumination adjuster 520 may be made from a plurality of adjustable lengths as previously illustrated and described. The illumination adjuster 520 forms a predetermined contour 524 along a longitudinal length of the illumination field 510. Preferably, the illumination contour 524 may be adjusted in relatively small increments in both the longitudinal and lateral direction. In the longitudinal direction, increments as small as one millimeter are easily achieved with much smaller dimensions achievable in the lateral direction. The longitudinal direction is only limited by the size of the blade inserted into the illumination field. The lateral or width dimension is only limited to the movement of the drive actuator. An adjustable contour drive 533 may be comprised of a plurality of solenoids, or their equivalent, to selectively or predeterminedly adjust or change the adjustable contour 524. Accordingly, the substantially rectangular illumination field 510 may be adjusted along its length in a predetermined way within the range of the maximum width is $W_{max}$ and the minimum width is $W_{min}$. The adjustable illumination field 510 is caused to scan a reticle 537 placed on a stage 535 by the stage control 539. Arrow 518 represents the scanning direction X. An adjustable slit control 541 is coupled to the illumination adjuster control 533 causing the adjustable contour to vary in a predetermined way, modifying the illumination field along a longitudinal length. The exposure dose provided to a photosensitive substrate during scanning can thereby be modified or adjusted to compensate for variations in line width. An exposure calculator 543 provides information to the adjustable slit control 541 to obtain a desired exposure dose to enhance the image of the reticle 537 reproduced on the photosensitive substrate.

In operation, as the illumination field 510 is scanned across the reticle 537, the width of the illumination field 510 is continuously adjusted and controlled by the adjustable slit control 541 based on information provided by the exposure calculator 543. Accordingly, the illumination energy or illumination intensity provided to the photosensitive substrate is dynamically adjusted over various local areas or regions to compensate for any variations in line width, non-uniformity in the illumination field, variations or irregularities in the reticle which may effect image quality on the photosensitive substrate, and particularities in the projection optics. All of the variables associated with a particular photolithographic system or tool are generally referred to as a signature. A system signature can readily be determined by exposure of test reticles to obtain the required individualized adaptations to an exposure dose in order to maintain or provide optimum reproduction of an image on a photosensitive substrate. In addition to the various variables associated with an advanced photolithographic system or tool, changes may occur over time which must be compensated for. For example, the illumination source may fluctuate, optics may age reducing their imaging properties, and reticles may vary. The dynamically adjustable slit of this embodiment of the present invention makes possible the fine adjustments to the illumination field and resulting exposure dose during a scanning exposure enhancing image reproduction on a photosensitive substrate. The adjusted or corrected exposure dose is readily calculable based upon the measured line widths of an exposed and processed substrate based upon exposure of a test reticle.

FIG. 14 schematically illustrates various local areas of line width variance or non-uniformity 545 on a processed photosensitive substrate 560. These local areas of line width variance or non-uniformity 545 may be caused by any one of a number of variables that may be known or unknown. However, the local areas in line with variance 545 are usually determined and measured by exposing a test reticle. After determining their location and measured variances, a corrected exposure dose may be calculated by known techniques.

FIG. 15 graphically illustrates the illumination energy provided to a photosensitive substrate utilizing the adjustable illumination field of the present invention. Under normal or ideal circumstances the illumination intensity or exposure dose would be uniform. However, the illumination energy 521 may be adjusted at various local areas so as to improve the quality of the image reproduced or printed. For example, location 515 may have an increase in illumination energy or exposure dose in order to reduce a line width, when a positive resist is utilized, on a photosensitive substrate. Similarly, location 519 represent an increase in illumination energy or intensity at another local area. Location 517 represent a decrease in illumination intensity or energy in another local area. It should be appreciated that by utilizing the adjustable slit of the present invention in a dynamic way during a scanning operation, any local area may have the illumination energy or exposure dose adjusted to improve image quality. Pattern reproduction, or printing.

FIG. 16 is a graph illustrating a photosensitive resist or photoresist exposure transfer or response function 532 for a positive photoresist. For a positive photoresist, increasing the exposure or dose will result in a decrease in line width, opaque line on a reticle, of the resulting processed photoresist covered substrate, and decreasing the exposure or dose will result in an increased line width in the resulting processed photoresist covered substrate. Waveform 534 illustrates this relationship; that is, increasing the exposure or dose will result in an increase in line width of the resulting processed photoresist covered substrate, and decreasing the exposure or dose will result in a decreased line width in the resulting processed photoresist covered substrate. A nominal center point 538 illustrates a dose d that will result in a width W for a particular photoresist. Point 536 represents a reduced dose $d^-$ resulting in an increased line width $W^+$. Point 540 represents an increased dose $d^+$ resulting in a reduced or decreased line width $W^-$. Accordingly, even though a predetermined line width W on a reticle is imaged onto a photosensitive substrate, the resulting processed line width may vary as a function of dose or exposure. As a result, based on the photolithographic tool signature and the response function, a corrected local exposure dose can be determined to substantially reduce line width variation in the local area.

FIG. 17 illustrates, in block diagram form, the embodiment of the present invention for dynamically adjusting the illumination field, and therefore, exposure dose in order to more accurately reproduce the image of a reticle onto a photosensitive substrate. Box 550 represents the step or act of determining the local locations of line width variations resulting from the projection of an image of a reticle with projection optics. Box 552 represents the step or act of calculating a corrected exposure dose to compensate for the line width variations. This calculation may be based upon the photoresist response function as illustrated in FIG. 16 for the particular photoresist used. Box 554 represents the step or act of calculating a reduced illumination field width to obtain the corrected exposure dose. This may easily be determined based upon the reduction of area of the illumination field and resulting illumination energy delivered to the photosensitive substrate. Box 556 represents the step or act of dynamically adjusting the width along a length of an illumination field while the illumination field is scanned over a reticle with the image of the reticle projected onto a photosensitive substrate. By practicing the above steps or acts according to this embodiment of the present invention, the image or pattern of a reticle reproduced on a photosensitive substrate is greatly improved.

FIG. 18 graphically illustrates a photolithographic system or tool capable of locally adjusting the exposure dose provided to a photosensitive substrate. An illumination source 562 projects the image of a reticle 537 held in a reticle stage 535 onto a photosensitive substrate 560. The image of the reticle 537 is projected onto the photosensitive substrate 560 with projection optics 549. Projection optics 549 may have a magnification of less than one. The photosensitive substrate 560 is placed on a wafer stage 558. The reticle 537 is placed in a reticle stage 535. The reticle stage 535 and the wafer stage 558 may be moved in parallel planes so as to provide parallel scanning of the illumination field 510 in the direction indicated by arrow 518. The reticle stage 535 and the wafer stage 558 are synchronized or controlled by stage control 539. Between the projection optics and the reticle 537 is positioned the illumination adjuster 520 providing the desired illumination field 510. The illumination adjuster 520 is adjusted by the illumination adjuster control 533. Accordingly, the width of a substantially rectangular illumination field 510 is controlled, as illustrated in FIG. 13. Data storage 547 stores data related to the projection optics, photoresist, reticle, and any other information effecting image quality or pattern reproduction. The data in data storage 547 is provided to an exposure calculator 543, which calculates an optimum exposure based on well known techniques, including the photoresist response function illustrated in FIG. 16. The exposure calculator 543 provides calculated information on the preferred or optimized exposure dose to adjustable slit control 541. The adjustable slit control 541 directs the illumination adjuster control 533 to drive the illumination adjuster 520, resulting in dynamically modifying the width of the illumination field 510 as the reticle 537 and the photosensitive substrate 560 are scanned in the direction indicated by arrow 518.

The embodiment of the present invention illustrated in FIGS. 13–18 facilitate improved performance of a photolithographic system or tool. By dynamically adjusting the illumination field width and therefore the illumination energy or exposure dose provided to the photosensitive substrate dynamically while scanning, local areas of variance may be compensated for. This controlling of the illumination intensity or illumination energy longitudinally along the slot or slit position and at preselected times during the scanning operation, makes possible the control of the illumination intensity which may be used to correct for at least two factors. The first fact being reticle blank variance in transmission with position on the reticle, and the second factor being any pattern of local variance from normal, reticle pattern print biased errors. The appropriate adjustable elements are driven in or out the correct amount to change the illumination level locally the exact amount needed to compensate for the local deviations. The electronics or drive systems to control the adjustable elements are straight forward and can be implemented in many ways well known to those skilled in the art. The necessary error signal corrections may be generated in many ways. Preferably, a one off calibration procedure is used. Here, a reticle to be used is printed on a specific photolithographic tool. The printed line width in the relevant local areas are examined and a line width error map generated. From lithographic knowledge of the sensitivity of line width to exposure, this map is turned into an exposure map indicating the difference in exposure required to obtain the desired line width. From this lithographic knowledge and knowledge of the system, the exposure map is transferred to an actuator position map over the whole extent of the reticle and corresponding photosensitive resist substrate. The relevant error correction information is stored in a system computer memory ready to be used when a particular reticle is used for printing. A library of reticle information may be stored and utilized, depending upon the reticle selected for use.

Accordingly, with this embodiment of the present invention, the exposure of different local areas may be adjusted easily, improving the performance of the photolithographic system. By providing greater control over the exposure of localized areas, the photolithographic system can be optimized, providing better reproduction of the pattern on the reticle being produced. Accordingly, due to the dynamic adjustments of illumination intensity or energy provided for exposure, it may be possible to use less expensive and complicated illumination systems or maintain a photolithographic tool in production with reduces maintenance due to the ability to control quickly and easily the illumination intensity or energy to compensate for system changes normally requiring down time.

This embodiment of the present invention is similar to U.S. patent application Ser. No. 09/232,756 filed on Jan. 15, 1999 and entitled "Dose Correction For Along Scan Linewidth Variation" invented by Andrew W. McCullough, which is herein incorporated by reference in its entirety.

Although the preferred embodiments have been illustrated and described, it will be apparent to those skilled in the art that various modifications may be made without departing from the spirit and scope of this invention as set forth in the claims.

What is claimed is:

1. A apparatus for adjusting an illumination field used in scanning photolithography comprising:
    a plurality of blades, said plurality of blades being pivotally connected together at each end;
    a plurality of push rods, one of each of said plurality of push rods coupled to connected ends of two of said plurality of blades;
    a drive connected to each of said plurality of push rods, said drive moving said push rods whereby said plurality of blades are moved into and out of the illumination field;
    a controller coupled to said drive, said controller controlling the movement of said drive;
    an exposure calculator coupled to said controller, said exposure calculator calculating a corrected exposure dose and required movement of said plurality of blades into and out of the illumination field to obtain the corrected exposure dose; and
    a data storage device coupled to said exposure calculator, said data storage device storing information required by said exposure calculator to calculate the corrected exposure dose,
    whereby the illumination field is dynamically adjusted during scanning of a photosensitive substrate reducing line width variations.

2. A apparatus for adjusting an illumination field used in scanning photolithography as in claim 1 wherein:
    said data storage device comprises data representative of a signature of a photolithographic system.

3. A apparatus for adjusting an illumination field used in scanning photolithography as in claim 1 wherein:
    said data storage device comprises data representative of a resist response function.

4. A apparatus for adjusting an illumination field used in scanning photolithography as in claim 1 wherein:
    said data storage device comprises data representative of a reticle.

5. An apparatus for controlling the exposure dose of a photosensitive substrate for use in scanning photolithography comprising:
    a plurality of adjustable links positioned along a longitudinal dimension of an illumination field, said links having a range of motion into and out of the illumination field;
    a drive coupled to said plurality of adjustable links, said drive individually moving each of said plurality of adjustable links;
    a drive control coupled to said drive, said drive control controlling the movement of each of said plurality of adjustable links into and out of the illumination field, whereby an exposure dose provided to the photosensitive substrate is adjusted during scanning of the illumination field over the photosensitive substrate;
    an exposure calculator coupled to said drive control, said exposure calculator providing said drive control with drive signals controlling the movement of each of said plurality of adjustable links into and out of the illumination field so as to provide a predetermined adjusted exposure dose; and
    a data storage device coupled to said exposure calculator, said data storage device providing stored information to said exposure calculator to calculate the predetermined adjusted exposure dose, whereby the illumination field is modified during scanning of the photosensitive substrate adjusting the exposure over local areas of the photosensitive substrate reducing line width variations.

6. An apparatus for controlling the exposure dose of a photosensitive substrate for use in scanning photolithography as in claim 5 wherein:

said data storage device comprises data representative of a photoresist response function, locations of line width variances, and a reticle.

7. An apparatus for controlling an illumination field scanned over a reticle for use in photolithography comprising;

an illumination adjuster extending along a dimension of the illumination field, said illumination adjuster modifying an edge of the illumination field along the dimension;

an exposure calculator, said exposure calculator calculating a corrected exposure dose for a portion of a photosensitive substrate; and an illumination adjuster control coupled to said exposure calculator and said illumination adjuster, said illumination adjuster control controlling the edge of the illumination field during the scanning exposure of the photosensitive substrate to obtain the corrected exposure dose, whereby local variances in patterns reproduced from a reticle are compensated for improving image reproduction.

8. A photolithographic system comprising:

an illumination source;

an adjustable illumination field aperture positioned to receive electromagnetic radiation from said illumination source;

an illumination adjuster positioned adjacent a dimension of said adjustable illumination field aperture, said illumination adjuster having an adjustable contour extending into and out of an illumination field;

a reticle stage positioned to receive electromagnetic radiation from said illumination adjuster;

projection optics positioned to receive electromagnetic radiation from a reticle held in said reticle stage;

a wafer stage positioned to receive electromagnetic radiation form said projection optics;

a stage control coupled to said reticle stage and said wafer stage, said stage control controlling the synchronous movement of said reticle stage and said wafer stage in a scanning operation exposing a photosensitive substrate placed on said reticle stage with an image of the reticle;

a data storage device, said data storage device storing information related to exposure dose and locations of line width variations from prior exposures of a photosensitive substrate;

an exposure calculator coupled to said data storage device, said exposure calculator calculating a corrected exposure dose resulting in reduced line width variations; and an illumination adjuster control coupled to said exposure calculator and said illumination adjuster, said illumination adjuster control controlling movement of the adjustable contour during the scanning operation, whereby the illumination field is dynamically adjusted resulting in the corrected exposure dose being provided to the photosensitive substrate reducing line width variations and accurately reproducing a pattern of the reticle on the photosensitive substrate.

* * * * *